United States Patent
Ushida et al.

(10) Patent No.: US 7,781,125 B2
(45) Date of Patent: Aug. 24, 2010

(54) LITHOGRAPHY MASK BLANK

(75) Inventors: Masao Ushida, Tokyo (JP); Megumi Takeuchi, Tokyo (JP); Osamu Suzuki, Tokyo (JP); Minoru Sakamoto, Tokyo (JP)

(73) Assignee: Hoya Corporation, Tokyo (JP)

( * ) Notice: Subject to any disclaimer, the term of this patent is extended or adjusted under 35 U.S.C. 154(b) by 852 days.

(21) Appl. No.: 10/525,524

(22) PCT Filed: Dec. 24, 2003

(86) PCT No.: PCT/JP03/16561

§ 371 (c)(1),
(2), (4) Date: Feb. 24, 2005

(87) PCT Pub. No.: WO2004/059384

PCT Pub. Date: Jul. 15, 2004

(65) Prior Publication Data

US 2005/0250018 A1  Nov. 10, 2005

(30) Foreign Application Priority Data

Dec. 26, 2002 (JP) ............... 2002-376275

(51) Int. Cl.
*G03F 1/00* (2006.01)
(52) U.S. Cl. ............... 430/5; 430/311; 430/394
(58) Field of Classification Search ............... 430/5, 430/311, 394; 716/19, 21
See application file for complete search history.

(56) References Cited

U.S. PATENT DOCUMENTS

| | | | | |
|---|---|---|---|---|
| 5,851,701 A | * | 12/1998 | Rolson | 430/5 |
| 2002/0058186 A1 | * | 5/2002 | Nozawa et al. | 430/5 |
| 2002/0086224 A1 | * | 7/2002 | Kanda | 430/5 |
| 2002/0122991 A1 | * | 9/2002 | Shiota et al. | 430/5 |
| 2002/0142249 A1 | * | 10/2002 | Ohshima | 430/283.1 |

FOREIGN PATENT DOCUMENTS

| | | |
|---|---|---|
| JP | 8-137089 A | 5/1996 |
| JP | 10-3162 A | 1/1998 |
| JP | 2966369 B2 | 8/1999 |
| JP | 2002-156742 A | 5/2002 |
| JP | 2002162726 A | 6/2002 |
| JP | 2003-149788 A | 5/2003 |

OTHER PUBLICATIONS

International Search Report for PCT/JP2003/016561 dated Apr. 20, 2004.

* cited by examiner

*Primary Examiner*—Mark F Huff
*Assistant Examiner*—Rashid Alam
(74) *Attorney, Agent, or Firm*—Sughrue Mion, PLLC

(57) ABSTRACT

A lithography mask blank used as a material for producing a lithography mask includes at least one thin film which is formed on a substrate and has a desired function. The blank has a nitrogen-containing thin film as the above-mentioned thin film and an ammonium ion production preventing layer for preventing production of ammonium ions, which is formed on the nitrogen-containing thin film or at least at a surface portion of the nitrogen-containing thin film and which is exposed on the surface of the lithography mask after the lithography mask is manufactured.

7 Claims, 4 Drawing Sheets

FIG. 1
(1)
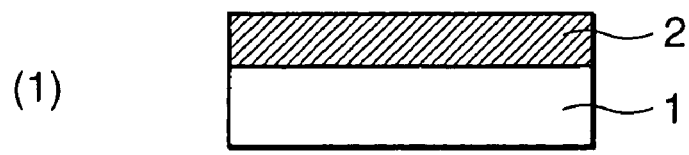
(2)
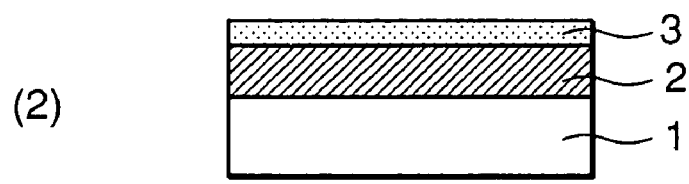
FIG. 2
(1)
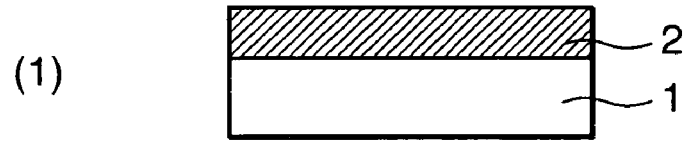
(2)
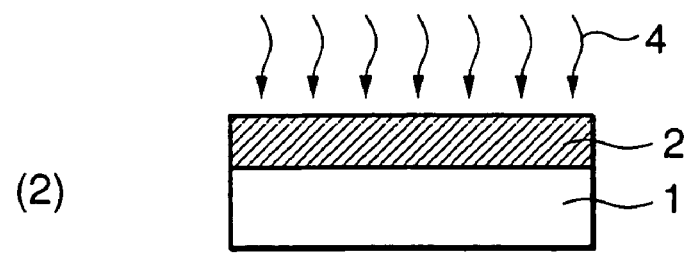

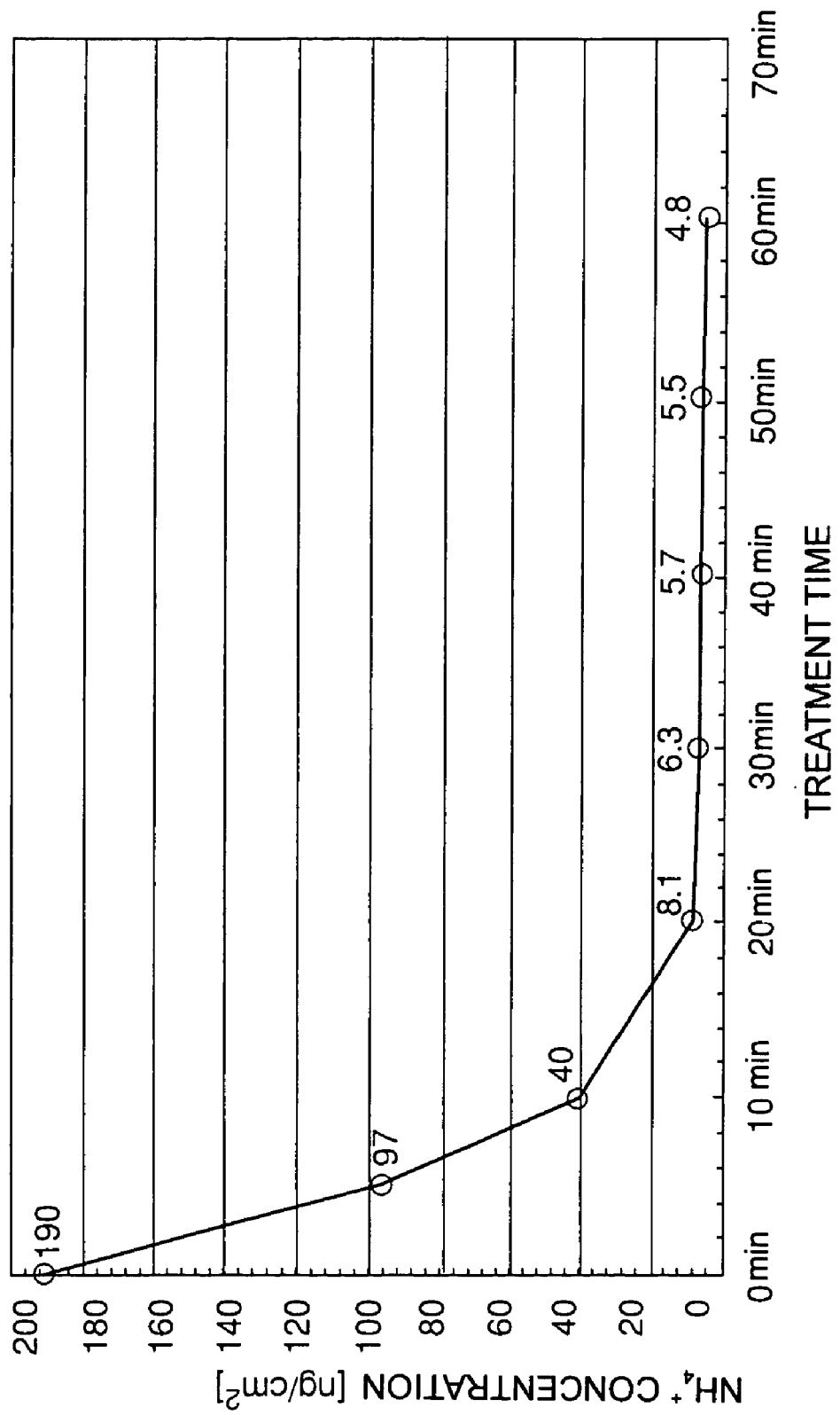

LITHOGRAPHY MASK BLANK

TECHNICAL FIELD

The present invention relates to a lithography mask blank serving as a material of lithography masks such as photomasks, electron beam masks, or X-ray masks for use in producing semiconductor devices and the like and to the lithography mask and, in particular, relates to a halftone phase shift mask blank serving as a material of halftone phase shift masks being one example of photomasks and to the halftone phase shift mask.

BACKGROUND ART

In the production of a semiconductor device, a transfer pattern is formed by, for example, irradiation of exposure light through a photomask (reticle).

As such a photomask, a photomask comprising a transparent substrate and a light-shielding film pattern formed thereon has been conventionally used. As a material of the light-shielding film, a chromium-based material (chromium alone, a material containing chromium and nitrogen, oxygen, carbon, or the like, or a layered film composed of these material films) has been generally used.

Further, in recent years, phase shift masks have been put to practical use in order to improve the resolution of transfer patterns. Various types (Levenson type, auxiliary pattern type, self-aligned type, etc.) of phase shift masks are known. Among them, a halftone phase shift mask suitable for high-resolution pattern transfer of holes and dots is known.

In the halftone phase shift mask, a light-semitransmissive film pattern having a phase shift of about 180 is formed on a transparent substrate and the light-semitransmissive film is formed by a single layer or multilayers. For example, the publication of Japanese Patent No. 2966369 discloses a light-semitransmissive film pattern which is formed by a thin film made of a substance containing metal such as molybdenum, silicon, and nitrogen as main components.

The light-semitransmissive film made of such a material can control a predetermined phase shift amount and transmittance by a single layer and further is excellent in acid resistance, light resistance, and so on.

As described above, as the film materials used in the photomasks, there have been developed not a few materials containing nitrogen for various reasons.

On the other hand, when pattern transfer is performed using a photomask (reticle), high-energy laser light is irradiated onto the photomask. As a result, chemical reactions on the photomask surface are accelerated by the laser irradiation. Therefore, formation of some deposits are accelerated so that the deposits are produced and adhered on the photomask as foreign substances. Ammonium sulfate has been confirmed as one of such deposits.

The photomask is genarally cleaned by the use of a sulfuric acid-based cleanser in the final process. It is considered that sulfuric acid or sulfuric acid ions derived from the sulfuric acid-based cleanser used in the cleaning process often remain on the photomask after the cleaning. Therefore, it is considered that reactions between the sulfuric acid ions and ammonium ions produced for some reason are accelerated by the laser irradiation so as to cause the production of the deposits.

Particularly, following finer formation of LSI patterns in recent years, the wavelength of exposure light sources (exposure light wavelength) has been changing toward a shorter wavelength, i.e. from a current KrF excimer laser (248 nm) to an ArF excimer laser (193 nm). Under these circumstances, in case where, a short-wavelength exposure light source such as the ArF excimer laser is used, the laser output becomes further higher. As a result, the formation of the deposits problematically tends to be readily accelerated so that the production of the foreign substances becomes more outstanding.

It is considered that a generation source of the ammonium ions is a substance or an adhering substance existing in the atmosphere or derived from a pellicle. However, as a result of researching thin films using materials containing nitrogen which are used in photomasks as described above, it has been found that more ammonium ions ($NH_4^+$) exist on the surfaces of the thin films containing nitrogen than on the surfaces of thin films containing no nitrogen. Therefore, it is considered that the nitrogen-containing thin film may contribute to the deposition of ammonium sulfate that can be a particle defect.

The present invention has been made in terms of the foregoing prior art problems and has an object to provide a lithography mask which is capable of reducing the production of ammonium ions caused by a component of a thin film, and a lithography mask blank which is capable of producing such a lithography mask.

Another object of the present invention is to provide a halftone phase shift mask which is capable of reducing the production of ammonium ions caused by a component of a thin film, and a halftone phase shift mask blank which is capable of producing such a halftone phase shift mask.

DISCLOSURE OF THE INVENTION

The present invention has the following aspects.

(First Aspect)

A lithography mask blank used as a material for manufacturing a lithography mask and comprising at least one layer in the form of a thin film having a required function and formed on a substrate, comprises, at least, a nitrogen-containing thin film as the foregoing thin film, and an ammonium ion production preventing layer for preventing production of ammonium ions, which is formed on the nitrogen-containing thin film or at least at a surface portion of the nitrogen-containing thin film and which is exposed on the surface of the lithography mask after the lithography mask is manufactured.

(Second Aspect)

In the lithography mask blank of the first aspect, the ammonium ion production preventing layer is a thin film containing less nitrogen than the nitrogen-containing thin film.

(Third Aspect)

In the lithography mask blank of the first aspect, the ammonium ion production preventing layer is formed by a heat treatment of the nitrogen-containing thin film.

(Fourth Aspect)

A photomask is manufactured using the photomask blank according to any of the first to third aspects.

(Fifth Aspect)

A halftone phase shift mask blank used as a material for manufacturing a halftone phase shift mask and comprising at least a light-semitransmissive film composed of one layer or multilayers, having a required transmittance and phase shift amount, and formed on a substrate, comprises, at least, a nitrogen-containing thin film as a thin film forming the light-semitransmissive film, and an ammonium ion production preventing layer for preventing production of ammonium ions, which is formed on the nitrogen-containing thin film or at least at a surface portion of the nitrogen-containing thin film and which is exposed on the surface of the mask after the mask is manufactured.

(Sixth Aspect)

In the halftone phase shift mask blank of the fifth aspect, the ammonium ion production preventing layer is a thin film containing less nitrogen than the nitrogen-containing thin film.

(Seventh Aspect)

In the halftone phase shift mask blank of the fifth aspect, the nitrogen-containing thin film contains at least silicon and nitrogen and the ammonium ion production preventing layer contains at least silicon and oxygen.

(Eighth Aspect)

In the halftone phase shift mask blank of the fifth aspect, the ammonium ion production preventing layer is formed by a heat treatment of the nitrogen-containing thin film.

(Ninth Aspect)

A halftone phase shift mask is manufactured using the halftone phase shift mask blank according to any of the fifth to eighth aspects.

BRIEF DESCRIPTION OF THE DRAWINGS

FIG. 1 is a sectional view for describing a halftone phase shift mask blank according to Example 1 of the present invention;

FIG. 2 is a sectional view for describing methods of manufacturing halftone phase shift mask blanks according to Examples 3 and 4 of the present invention;

FIG. 5 is a diagram showing a relationship between a heat treatment time and an ammonium ion concentration on the film surface in Example 4.

BEST MODE FOR CARRYING OUT THE INVENTION

Figure 3:
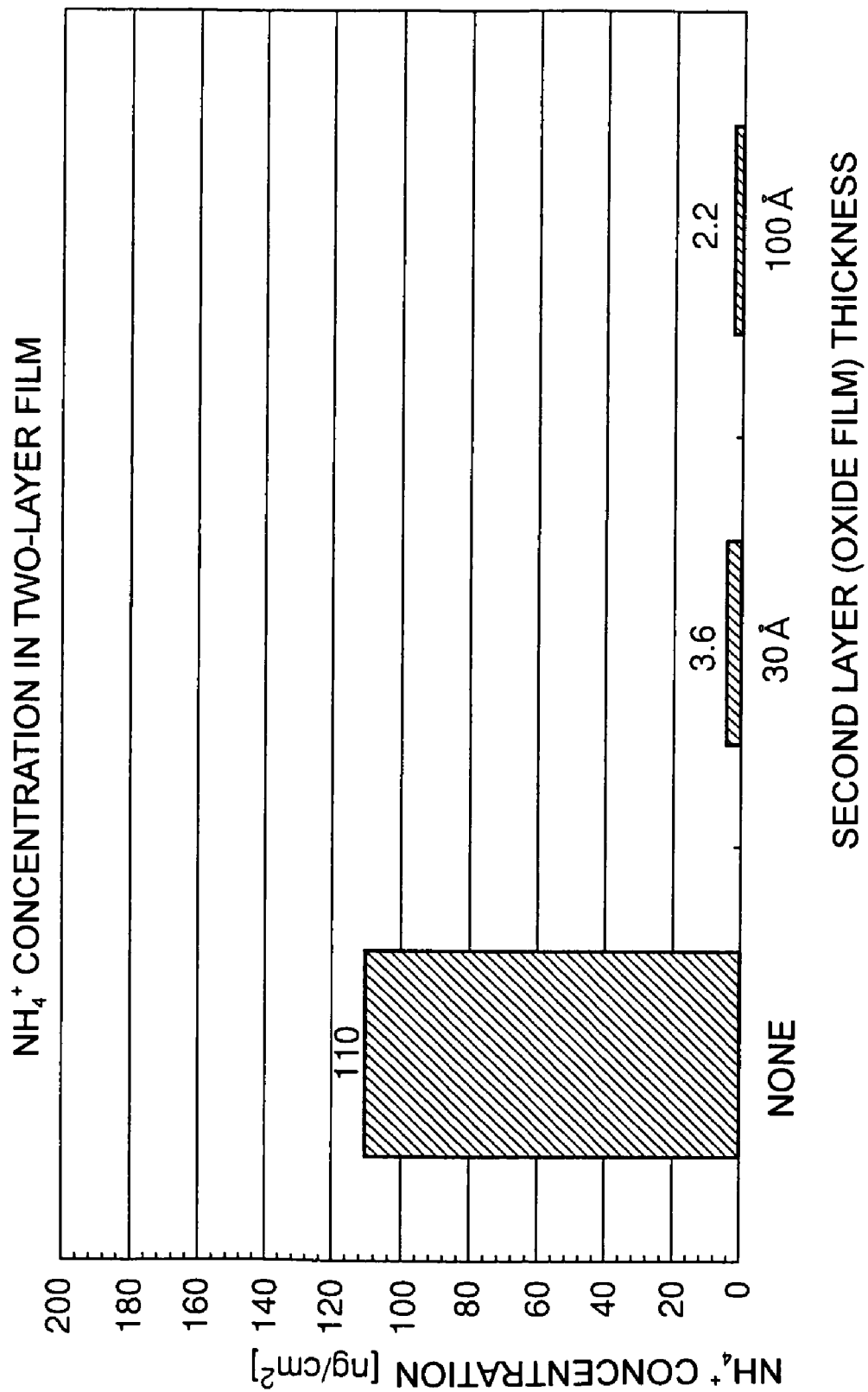
FIG. 3 is a diagram showing a relationship between the presence/absence of an ammonium production preventing layer and an ammonium ion concentration on the film surface in Example 1.

Hereinbelow, the present invention will be described in detail.

Based on the fact that, in a lithography mask blank such as a photomask blank, ammonium ions are extracted on a nitrogen-containing thin film whose surface is exposed outside after a mask is manufactured, the present inventors have estimated that the production of ammonium ions is caused by nitrogen in the film. Since it has been confirmed that even the nitrogen-containing thin film hardly contains ammonium ions therein, it is considered that the nitrogen component in the thin film causes some change in quality at the surface of the film to produce the ammonium ions.

In the present invention, an ammonium ion production preventing layer for preventing the production of ammonium ions is formed on a nitrogen-containing thin film or at least at a surface portion of a nitrogen-containing thin film to thereby prevent the production of ammonium ions on the film surface considered to be caused by nitrogen in the film. In this manner, the production of ammonium ions considered to be caused by nitrogen in the film is reduced in the layer whose surface is exposed outside after a mask is manufactured.

As a result, the ammonium ion concentration on the film surface is reduced so that even if sulfuric acid, sulfuric acid ions, or the like remains in sulfuric acid cleaning of a mask blank thereafter, in sulfuric acid cleaning of a photomask manufactured using a mask blank thereafter, it is possible to suppress the production of foreign substances such as ammonium sulfate caused by ammonium ions due to laser irradiation during exposure.

In the present invention, the surface after treated for preventing the production of foreign substances caused by ammonium ions from ammonium sulfate or the like has the ammonium ion ($NH_4^+$) concentration reduced as compared with that before the treatment, when the ammonium ion ($NH_4^+$) concentration is measured by an ion chromatography method using pure water extraction or the like. For example, the treatment is performed so that the $NH_4^+$ concentration measured by the ion chromatography method becomes 20 ng/cm$^2$ or less, preferably 10 ng/cm$^2$ or less, and more preferably 5 ng/cm$^2$ or less.

In the present invention, the formation of the ammonium ion production preventing layer is carried out so as not to impair the primary function of the thin film. Alternatively, it is adjusted to have the primary function when the ammonium ion production preventing layer is formed.

In the present invention, the formation of the ammonium ion production preventing layer can be carried out when or after a mask blank is manufactured or when or after a mask is manufactured.

The following two methods are typically considered as ammonium ion production preventing layer forming methods.

(1) To provide a layer, on the outermost surface, containing a small quantity of substance that causes the production of ammonium ions.

(2) To form at least the outermost surface as a layer that hardly elutes a substance causing the production of ammonium ions or a layer that suppresses the production of ammonium ions, even if such a substance exists.

With respect to the method (1), there is, specifically, a method of forming a thin film (ammonium ion production preventing layer) containing less nitrogen than the nitrogen-containing thin film. Such an ammonium ion production preventing layer is additionaly formed on the nitrogen-containing thin film. By covering the nitrogen-containing thin film with the thin film containing less nitrogen than the nitrogen-containing thin film, the presence of nitrogen on the surface, which is exposed outside after the mask is formed, becomes less. This makes it possible to prevent the production of ammonium ions on the thin film surface due to nitrogen in the thin film. It is noted here that the thin film containing less nitrogen includes a thin film containing substantially no nitrogen.

With respect to the method (2), there is specifically cited, for example, a heat treatment of the nitrogen-containing thin film. By carrying out the heat treatment in the atmosphere, an atmosphere containing oxygen in the form of $O_2$, $CO_2$, or the like, an atmosphere of inert gas such as nitrogen or Ar, a vacuum, or the like, the nitrogen-containing thin film of the mask blank and its surface layer portion are subjected to thermal perturbation.

This accelerates rearrangement of the film structure so that, for example, dangling bonds of silicon and nitrogen being thin film forming elements are efficiently combined at the film surface layer portion, thereby changing to a stable state.

On the other hand, depending on the atmosphere where the heat treatment is performed, an extremely thin dense oxide film, for example, is formed through reactions between the film surface likewise subjected to the thermal perturbation and the atmosphere, thereby also satisfying the foregoing method (1).

That is, by the proper application of thermal energy, the photomask surface is changed in quality to a chemically more stable state. This makes it possible to suppress the production of ammonium ions on the thin film surface.

In order to achieve such a preferable action, the heat treatment temperature is preferably 180° C. or higher, and more preferably 250° C. or higher.

Although depending on a treatment temperature and a treatment atmosphere, the heat treatment time is 5 minutes or more at minimum, and preferably 10 minutes or more in consideration of uniformly applying the thermal perturbation to the photomask blank and stably controlling the change in quality inside the thin film.

When the heat treatment temperature exceeds 400° C., in an active atmosphere containing oxygen, for example, reaction with the thin film surface may drastically proceed to impair the function of the thin film, which thus should be taken into account.

In the case of the heat treatment at high temperatures, it is preferable that the heat treatment be carried out in an atmosphere containing no oxygen or where the oxygen concentration is fully controlled.

As a method other than the foregoing heat treatment, such a method may also be considered wherein a substance for suppressing the production of ammonium ions due to nitrogen coexists with nitrogen in the film. Oxygen, for example, is cited as such a substance that suppresses the production of ammonium ions, while, as a method of forming such an ammonium ion production preventing layer, there is a method of implanting oxygen ions or the like into the surface of the nitrogen-containing thin film or a method of performing a surface treatment such as a surface oxidation treatment using heat, plasma, or the like.

In the present invention, foreign substances caused by ammonium ions comprises ammonium sulfate, ammonium salt containing ammonium sulfate as a main component, other ammonium salts, and so on.

In the present invention, as a thin film having a required function in a photomask blank, use is made of, for example, a light-shielding film, a reflection preventing film, a light-semitransmissive film for a halftone phase shift mask, or the like. Such a thin film often corresponds to a thin film whose surface is exposed outside after a photomask is manufactured.

A halftone phase shift mask blank in the present invention comprises, at least, a nitrogen-containing thin film as a thin film forming a light-semitransmissive film, and an ammonium ion production preventing layer for preventing the production of ammonium ions, which is formed on the nitrogen-containing thin film or at least at a surface portion of the nitrogen-containing thin film and whose surface is exposed outside after the mask is manufactured.

When the nitrogen-containing thin film is the light-semitransmissive film, having a required transmittance and phase shift amount, of the halftone phase shift mask blank as described above, the nitrogen-containing thin film represents a light-semitransmissive film of a single-layer structure composed of the nitrogen-containing thin film or a nitrogen-containing thin film, of a light-semitransmissive film of a multilayer structure, formed just under the ammonium ion production preventing layer.

Herein, as a material of the light-semitransmissive film of the single-layer structure, use is made of, for example, a material containing silicon and nitrogen, a material containing metal, silicon, and nitrogen, or a material containing, in addition thereto, at least one selected from oxygen, fluorine, carbon, and hydrogen. As the metal, use is made of at least one selected from molybdenum, tantalum, tungsten, chromium, titanium, nickel, palladium, hafnium, zirconium.

Such a material film can be formed by implementing reactive sputtering in an atmosphere of reactive gas such as nitrogen by the use of a target made of silicon, or metal and silicon, while it can also be formed using a target containing nitrogen and so on.

As the light-semitransmissive film of the multilayer structure, use is made of a film in which the material films each forming the light-semitransmissive film of the single-layer structure are stacked in two or more layers or a film comprising a transmittance adjusting layer such as a metal film containing at least one selected from chromium, tantalum, hafnium, magnesium, aluminum, titanium, vanadium, yttrium, zirconium, niobium, molybdenum, tin, lanthanum, tungsten, silicon and the foregoing single-layer material (halftone film) which are stacked in layers. In order to achieve an effect as a halftone phase shift film, the light-semitransmissive film has a phase difference set to about 180° and a transmittance is set to a value selected from a range of 3 to 40%.

Particularly, when the ammonium ion production preventing layer is formed on the material layer containing metal, silicon, and nitrogen or the material layer containing, in addition thereto, at least one selected from oxygen, fluorine, carbon, and hydrogen, use can be made of, as a material of the ammonium ion production preventing layer, a material containing silicon and oxygen or a material containing, in addition thereto, one kind selected from metal, nitrogen (less amount of nitrogen as compared with the nitrogen-containing layer), and carbon.

Hereinbelow, the present invention will be described in further detail using examples.

EXAMPLE 1

Three halftone phase shift mask blanks were prepared in each of which a light-semitransmissive film 2 (film thickness: about 935 angstroms) of nitrided molybdenum and silicon (MoSiN) was formed on a transparent substrate 1 by reactive sputtering (DC sputtering) in a mixed gas atmosphere of argon (Ar) and nitrogen ($N_2$) (Ar:$N_2$=10%:90%, pressure: 0.2 Pa) using a mixture target of molybdenum (Mo) and silicon (Si) (Mo:Si=20:80 mol %) (see (1) in FIG. 1). Each halftone phase shift mask blank had a transmittance of 5.5% and a phase shift of about 180° with respect to a KrF excimer laser (wavelength: 248 nm).

On the light-semitransmissive films 2 of the two phase shift blanks, ammonium ion production preventing layers 3 (thickness: about 30 angstroms and 100 angstroms, respectively) each in the form of a thin film of oxidized molybdenum and silicon (MoSiO) were formed by reactive sputtering (DC sputtering) in a mixed gas atmosphere of argon (Ar) and oxygen ($O_2$) (Ar:$O_2$=60%:40%, pressure: 0.2 Pa) using the same target as described above, respectively, thereby manufacturing halftone phase shift mask blanks (see (2) in FIG. 1).

Each of these halftone phase shift mask blanks may have a light-semitransmissive film in the form of a MoSiN film+a MoSiO film.

FIG. 3 shows the results of measuring, by the ion chromatography method, ammonium ion concentrations on the film surfaces in the sample not applied with the processing for preventing the production of foreign substances such as ammonium sulfate caused by ammonium ions (indicated as "None" in the figure) and the samples applied with the processing for preventing the production of foreign substances such as ammonium sulfate caused by ammonium ions (indicated in terms of film thickness in the figure). As clear from this figure, it is understood that ammonium ions on the film surface are remarkably reduced with respect to the samples applied with the ammonium sulfate production preventing process.

Then, after forming a chromium-based light-shielding film on the thin film in the form of the MoSiO film, a resist film was formed and a resist pattern was formed by pattern exposure and development. Then, the MoSiO film and the MoSiN film were etched by dry etching using $CF_4+O_2$ gas and, after removing the resist, each sample was cleaned with 98% sulfuric acid ($H_2SO_4$) at 100° C. and rinsed with pure water. Thus, phase shift masks were obtained.

With respect to each of these phase shift masks, since the sample applied with the processing for preventing the production of foreign substances such as ammonium sulfate caused by ammonium ions has less ammonium ions on the film surface, it is possible to reduce the production of foreign substance defect caused by ammonium sulfate when pattern transfer is performed by laser irradiation using a KrF excimer laser or the like.

EXAMPLE 2

Three halftone phase shift mask blanks were prepared in each of which a light-semitransmissive film 2 (film thickness: about 800 angstroms) of nitrided molybdenum and silicon (MoSiN) was formed on a transparent substrate 1 by reactive sputtering (DC sputtering) in a mixed gas atmosphere of argon (Ar) and nitrogen ($N_2$) (Ar:$N_2$=10%:90%, pressure: 0.2 Pa) using a mixture target of molybdenum (Mo) and silicon (Si) (Mo:Si=8:92 mol %) (see (1) in FIG. 1). Each halftone phase shift mask blank had a transmittance of 5.5% and a phase shift of about 180° with respect to an ArF excimer laser (wavelength: 193 nm).

Two halftone phase shift mask blanks were prepared in each of which the light-semitransmissive film 2 (film thickness: about 800 angstroms) of nitrided molybdenum and silicon (MoSiN) was formed on the transparent substrate 1 that was the same as that in Example 1.

On the light-semitransmissive films 2 of the phase shift blanks, ammonium ion production preventing layers 3 (thickness: about 30 angstroms and about 100 angstroms, respectively) each in the form of a thin film of SiON were formed by reactive sputtering (DC sputtering) in a mixed gas atmosphere of argon (Ar), nitrogen ($N_2$), and oxygen ($O_2$) (Ar:$N_2$:$O_2$=20%:60%:20%, pressure: 0.1 Pa) using a silicon target, respectively. Thus, halftone phase shift mask blanks were produced. It is noted here that the composition of the MoSiN layer is Mo:Si:N=5:45:50at%, while the composition of the SiON layer is Si:O:N=42:43:15at%. Therefore, the content of nitrogen is smaller in "the ammonium ion production preventing layer" than in "the nitrogen-containing layer".

Each of these halftone phase shift mask blanks may have a light-semitransmissive film in the form of a MoSiN film+a SiON film.

As a result of measuring ammonium ion concentrations on the film surfaces in these halftone phase shift mask blanks by the ion chromatography method, it was 3.5 ng/cm² with respect to the sample with the film thickness of 30 angstroms while it was 2.8 ng/cm² with respect to the sample with the film thickness of 100 angstroms.

Then, after forming a chromium-based light-shielding film on the thin film in the form of the SiON film, a resist film was formed and a resist pattern was formed by pattern exposure and development. Subsequently, the SiON film and the MoSiN film were etched by dry etching using $CF_4+O_2$ gas and, after removing the resist, each sample was cleaned with 98% sulfuric acid ($H_2SO_4$) at 100° C. and rinsed with pure water. Thus, phase shift masks were obtained.

With respect to each of these phase shift masks, since the sample applied with the processing for preventing the production of foreign substances such as ammonium sulfate caused by ammonium ions has less ammonium ions on the film surface, it is possible to reduce the production of foreign substance defect caused by ammonium sulfate when pattern transfer is performed by laser irradiation using a ArF excimer laser or the like.

In the present invention, in order to remarkably reduce ammonium ions on the film surface, the thickness of the ammonium production preventing layer is preferably 10 angstroms or more, and more preferably 30 angstroms or more.

EXAMPLE 3

Like in Example 1, a light-semitransmissive film (film thickness: about 935 angstroms) 2 of nitrided molybdenum and silicon (MoSiN) was formed on a transparent substrate 1 (see (1) in FIG. 2).

Figure 4:
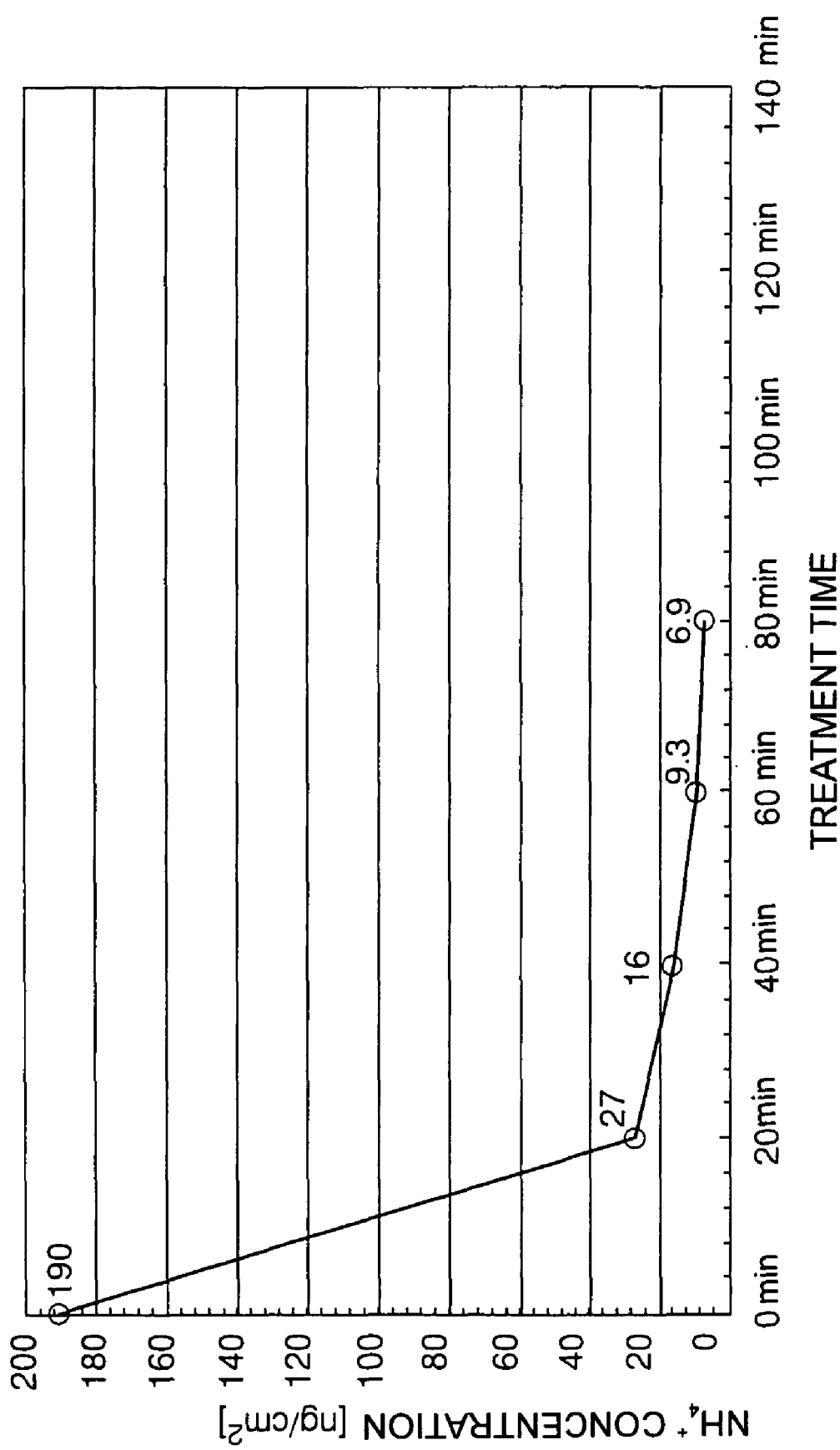
FIG. 4 is a diagram showing a relationship between a heat treatment time and an ammonium ion concentration on the film surface in Example 3.

Then, a heat treatment 4 was carried out at 280° C. in the atmosphere (see (2) in FIG. 2). FIG. 4 shows the result of measuring, by the ion chromatography method, a relationship between a heat treatment time and an ammonium ion concentration on the film surface.

As clear from FIG. 4, it has been found that ammonium ions are reduced by the heat treatment and, particularly when the heat treatment time exceeds 15 minutes or so, the ammonium ions are remarkably reduced. This is because it is considered that, in this example, thermal perturbation applied to the mask blank is uniformly and effectively exerted over the whole surface of the thin film after the lapse of about 15 minutes from the start of the heat treatment.

Next, the mask processing like in Example 1 was carried out to thereby obtain a phase shift mask.

With respect to this phase shift mask, since the sample applied with the ammonium sulfate production preventing process had less ammonium ions on the film surface, it was possible to reduce the production of foreign substance defect caused by ammonium sulfate when pattern transfer was performed by laser irradiation using a KrF excimer laser or the like.

EXAMPLE 4

Like in Example 1, a light-semitransmissive film (film thickness: about 935 angstroms) 2 of nitrided molybdenum and silicon (MoSiN) was formed on a transparent substrate 1 (see (1) in FIG. 2).

Then, a heat treatment 4 was carried out at 400° C. in a nitrogen atmosphere (see (2) in FIG. 2). FIG. 5 shows the result of measuring a heat treatment time and an ammonium ion concentration on the film surface by the ion chromatography method.

As clear from FIG. 5, it has been found that ammonium ions are reduced by the heat treatment and, particularly when the heat treatment time exceeds 20 minutes or so, the ammonium ions are remarkably reduced. This is because it is considered that, in this example, thermal perturbation applied to the photomask blank is uniformly and effectively exerted over the whole surface of the thin film after the lapse of about 20 minutes from the start of the heat treatment.

Then, the mask processing like in Example 1 was carried out to thereby obtain a phase shift mask.

With respect to this phase shift mask, since the sample applied with the ammonium sulfate production preventing process had less ammonium ions on the film surface, it was possible to reduce the production of foreign substance defect caused by ammonium sulfate when pattern transfer was performed by laser irradiation using a KrF excimer laser or the like.

INDUSTRIAL APPLICABILITY

According to the present invention, a thin film whose surface is exposed outside after a photomask is manufactured is a thin film containing at least nitrogen, and the surface of the nitrogen-containing thin film is applied with the processing for preventing the production of foreign substances such as ammonium sulfate caused by ammonium ions. As a consequence, it is possible to obtain a photomask blank enabling the production of a photomask that does not deposit ammonium sulfate upon laser irradiation.

The invention claimed is:

1. A halftone phase shift mask blank used as a material for manufacturing a halftone phase shift mask comprising:
   a substrate,
   a light-semitransmissive film having a required transmittance and phase shift amount and formed on said substrate, said light-semitransmissive film being one of (1) a single-layer structure containing a metal, silicon and nitrogen or (2) a multi-layer structure having an upper layer in a direction away from said substrate that contains a metal, silicon and nitrogen, and
   an ammonium ion production preventing layer for preventing production of ammonium ions, which is formed with an oxidation of one of (1) a surface portion of said light-semitransmissive film of the single-layer structure or (2) a surface portion of said upper layer in said light-semitransmissive film of the multi-layer structure, respectively, so as to contain a metal, silicon, nitrogen and oxygen and which is exposed on the surface of said mask after said mask is manufactured,
   said ammonium ion production preventing layer being less in nitrogen content (1) relative to said light-semitransmissive film other than the surface portion in said single-layer structure or (2) relative to said upper layer other than the surface portion in said multi-layer structure, respectively.

2. A halftone phase shift mask comprising:
   a substrate,
   a light-semitransmissive film having a required transmittance and phase shift amount and formed on said substrate, said light-semitransmissive film being one of (1) a single-layer structure containing a metal, silicon and nitrogen or (2) a multi-layer structure having an upper layer containing a metal, silicon and nitrogen, and
   an ammonium ion production preventing layer for preventing production of ammonium ions, which is formed with an oxidation of one of (1) a surface portion of said light-semitransmissive film of the single-layer structure or (2) a surface portion of said upper layer in said light-semitransmissive film of the multi-layer structure, respectively, so as to contain a metal, silicon, nitrogen and oxygen and which is exposed on the surface of said mask after said mask is manufactured,
   said ammonium ion production preventing layer being less in nitrogen content (1) relative to said light-semitransmissive film other than the surface portion in said single-layer structure or (2) relative to said upper layer other than the surface portion in said multi-layer structure, respectively,
   said light-semitransmissive film and said ammonium ion production preventing layer being provided with a predetermined pattern.

3. A halftone phase shift mask blank according to claim 1, wherein:
   said ammonium ion production preventing layer has film thickness thinner than said light-semitransmissive film.

4. A halftone phase shift mask blank according to claim 1, wherein:
   said ammonium ion production preventing layer has a chemically stable state in film structure relative to said light-semitransmissive film.

5. A halftone phase shift mask blank according to claim 1, wherein:
   said light-semitransmissive film contains molybdenum as said metal.

6. A halftone phase shift mask blank according to claim 1, wherein:
   a concentration of said ammonium ion is 20 ng/cm$^2$ or less.

7. A halftone phase shift mask blank according to claim 1, wherein:
   an exposure light source to the lithography mask is a KrF excimer laser or an ArF excimer laser.

* * * * *